United States Patent
Manganaro

(10) Patent No.: US 12,231,140 B2
(45) Date of Patent: Feb. 18, 2025

(54) MITIGATION OF UNDESIRED SPECTRAL IMAGES DUE TO BANDWIDTH MISMATCH IN TIME-INTERLEAVED A/DS BY SAMPLING CAPACITANCE RANDOMIZATION

(71) Applicant: MediaTek Inc., Hsin-Chu (TW)

(72) Inventor: Gabriele Manganaro, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 177 days.

(21) Appl. No.: 17/982,339

(22) Filed: Nov. 7, 2022

(65) Prior Publication Data
US 2023/0299784 A1    Sep. 21, 2023

Related U.S. Application Data

(60) Provisional application No. 63/320,748, filed on Mar. 17, 2022.

(51) Int. Cl.
*H03M 1/12* (2006.01)
*H03M 1/10* (2006.01)

(52) U.S. Cl.
CPC ....... *H03M 1/1245* (2013.01); *H03M 1/1009* (2013.01)

(58) Field of Classification Search
CPC ............. H03M 1/1245; H03M 1/1009; H03M 1/0624; H03M 1/0656; H03M 1/0836; H03M 1/1215
See application file for complete search history.

(56) References Cited

U.S. PATENT DOCUMENTS

| | | | |
|---|---|---|---|
| 6,720,900 B2 * | 4/2004 | Matsumoto | H03M 1/188 341/123 |
| 7,015,842 B1 * | 3/2006 | Gupta | G11C 27/024 341/122 |

(Continued)

FOREIGN PATENT DOCUMENTS

| | | |
|---|---|---|
| TW | I605688 B | 11/2017 |
| TW | I672005 B | 9/2019 |
| TW | 202110100 A | 3/2021 |

OTHER PUBLICATIONS

EP 23159788.1, Aug. 21, 2023, Extended European Search Report.
Ali et al., A 12-b 18-GS/s RF sampling ADC with an integrated wideband track-and-hold amplifier and background calibration. IEEE Journal of Solid-State Circuits. Sep. 30, 2020;55(12):3210-24.

(Continued)

*Primary Examiner* — Lam T Mai
(74) *Attorney, Agent, or Firm* — Winston Hsu

(57) ABSTRACT

Described herein are techniques for mitigating bandwidth mismatch in time-interleaved (TI) analog-to-digital converters (ADC). The techniques described herein involve spreading the energy associated with spurious tones resulting from bandwidth mismatch across the frequency spectrum, thereby reducing the overall impact of each individual tone. In some embodiments, for example, the tones may disappear under the noise floor. Spreading the energy associated with the spurious tones can be achieved by increasing the periodicity of the phase oscillation. This, in turn, can be achieved by introducing, in the phase oscillation, artificial phase shifts in addition to the phase shifts arising due to bandwidth mismatch. In one example, increasing the periodicity of a phase oscillation from 4 phase samples to 8 phase samples can result in a reduction in the power of a tone as high as 7 dB.

18 Claims, 15 Drawing Sheets

(56) References Cited

U.S. PATENT DOCUMENTS

| | | | | |
|---|---|---|---|---|
| 7,292,170 | B2* | 11/2007 | Kinyua | H03M 1/0624 |
| | | | | 341/155 |
| 8,810,442 | B1* | 8/2014 | Zortea | H03M 1/0809 |
| | | | | 341/120 |
| 9,680,489 | B2* | 6/2017 | Zortea | H03M 1/1023 |
| 9,692,436 | B2* | 6/2017 | Zortea | H03M 1/1009 |
| 10,341,145 | B2* | 7/2019 | Musah | H04L 25/03019 |
| 11,082,054 | B1* | 8/2021 | Cascio | H03M 1/0697 |
| 2010/0226330 | A1* | 9/2010 | Haque | H04B 1/28 |
| | | | | 370/329 |
| 2012/0069884 | A1* | 3/2012 | Sakurai | H03L 7/091 |
| | | | | 375/224 |
| 2014/0152477 | A1* | 6/2014 | Lewis | H03M 1/1061 |
| | | | | 341/122 |
| 2015/0349794 | A1* | 12/2015 | Lin | H03M 1/1019 |
| | | | | 341/120 |
| 2017/0237419 | A1* | 8/2017 | Clara | H03K 5/13 |
| | | | | 327/231 |
| 2019/0131990 | A1* | 5/2019 | Ali | H03M 1/0639 |
| 2021/0281271 | A1* | 9/2021 | Bales | H03M 1/1215 |
| 2021/0359694 | A1* | 11/2021 | Chen | H03M 1/0624 |
| 2021/0409035 | A1* | 12/2021 | Lindholm | H03M 1/68 |
| 2022/0131549 | A1* | 4/2022 | Huang | H03M 1/1061 |

OTHER PUBLICATIONS

Devarajan et al., A 12-b 10-GS/s interleaved pipeline ADC in 28-nm CMOS technology. IEEE Journal of Solid-State Circuits. Nov. 9, 2017;52(12):3204-18.

Kurosawa et al., Explicit analysis of channel mismatch effects in time-interleaved ADC systems. IEEE Transactions on Circuits and Systems I: Fundamental Theory and Applications. Mar. 2001;48(3):261-71.

Vogel et al., A review on low-complexity structures and algorithms for the correction of mismatch errors in time-interleaved ADCs. Invited Paper. 10th IEEE International NEWCAS Conference Jun. 17, 2012:349-52.

Vogel et al., A flexible and scalable structure to compensate frequency response mismatches in time-interleaved ADCs. IEEE Transactions on Circuits and Systems I: Regular Papers. Feb. 18, 2009;56(11):2463-75.

Extended European Search Report for European Application No. 23159788.1 dated Aug. 21, 2023.

Park et al., A scalable bandwidth mismatch calibration technique for time-interleaved ADCs. IEEE Transactions on Circuits and Systems I: Regular Papers. Nov. 2016;63(11):1889-97.

* cited by examiner

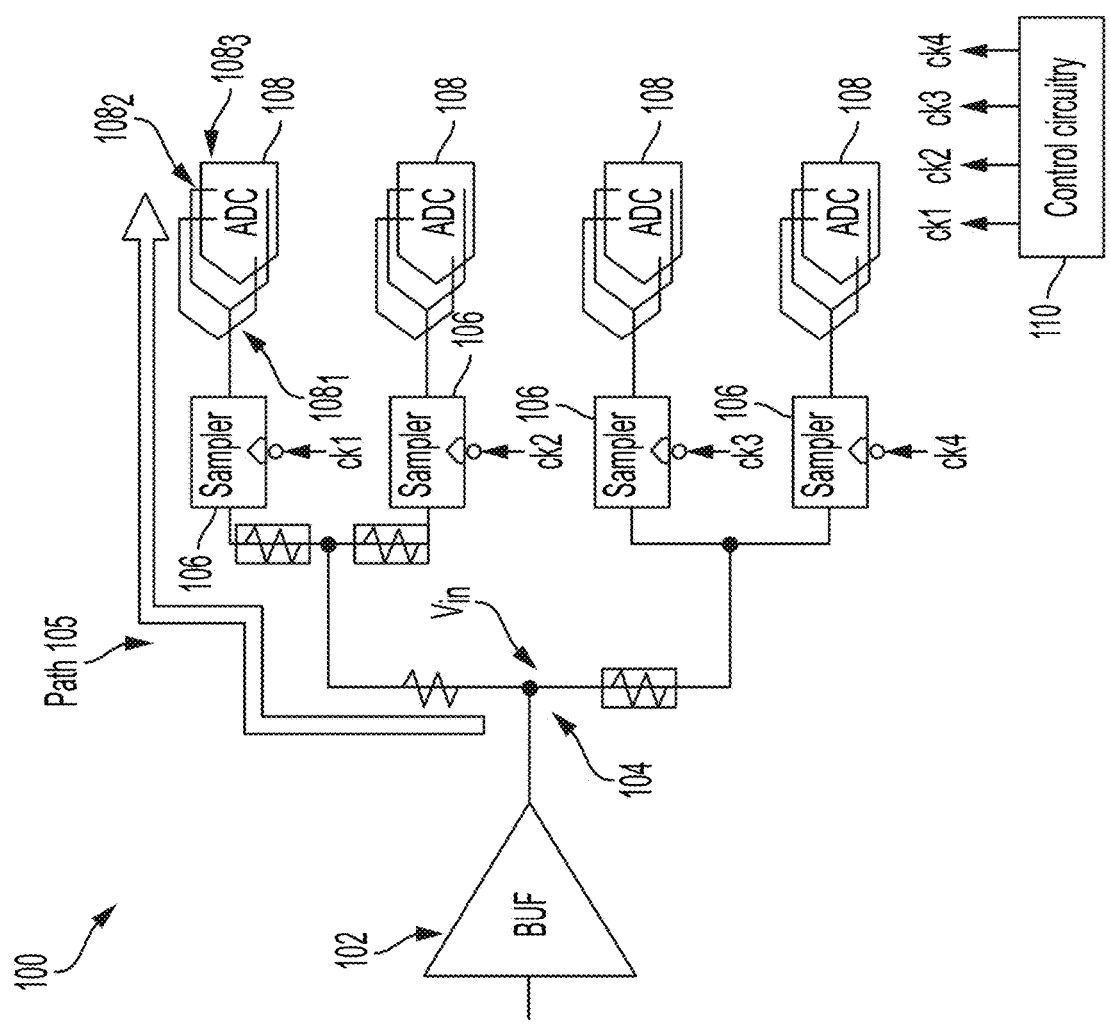

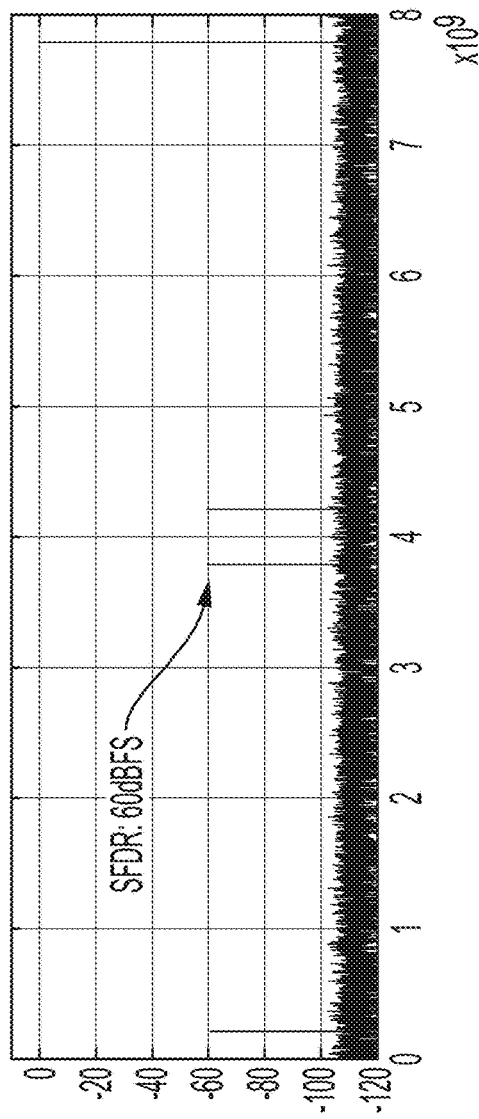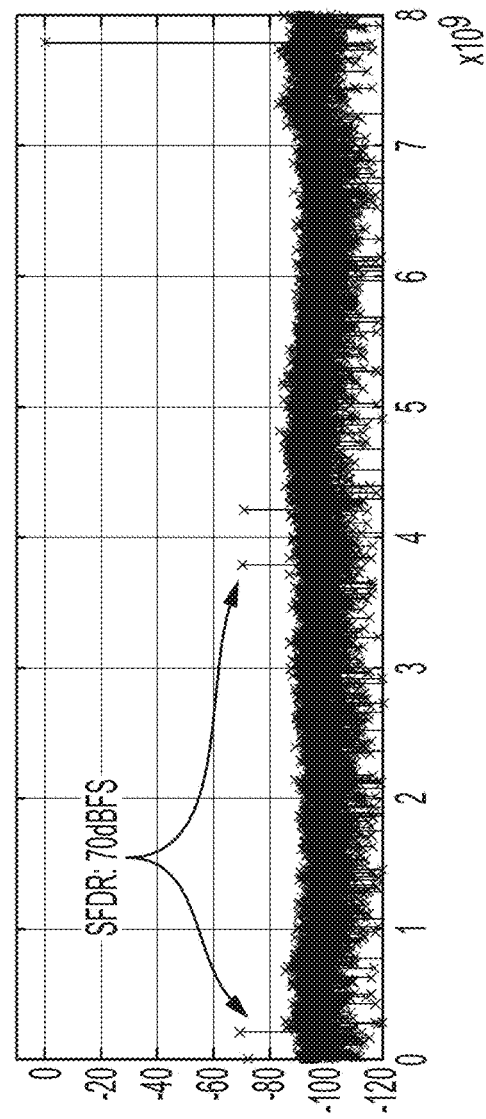

MITIGATION OF UNDESIRED SPECTRAL IMAGES DUE TO BANDWIDTH MISMATCH IN TIME-INTERLEAVED A/DS BY SAMPLING CAPACITANCE RANDOMIZATION

CROSS REFERENCE TO RELATED APPLICATIONS

This Application claims priority under 35 U.S.C. § 119(e) to U.S. Provisional Application No. 63/320,748, entitled "MITIGATION OF UNDESIRED SPECTRAL IMAGES DUE TO BANDWIDTH MISMATCH IN TIME-INTERLEAVED A/DS BY SAMPLING CAPACITANCE RANDOMIZATION" filed on Mar. 17, 2022, which is herein incorporated by reference in its entirety.

BACKGROUND

Time interleaved (TI) analog-to-digital converters (ADC) sample input signals using multiple ADC units in a time-multiplexed fashion. TI ADCs are used in a broad variety of applications, including in high-end instrumentations, Radar and Lidar, and wireless infrastructure (e.g., 5G cellular towers).

BRIEF SUMMARY

Some embodiments relate to a time-interleaved (TI) analog-to-digital converter (ADC), comprising: an input terminal; a set of N paths electrically coupled to the input terminal, each path comprising a sampler configured to sample an input signal appearing at the input terminal, wherein N is a positive integer, wherein the N paths result in a phase oscillation of the input signal as appearing at the samplers, wherein the phase oscillation presents at most N phase values, and wherein the phase oscillation oscillates in accordance with a first periodicity; and control circuitry configured to control at least some of the N samplers to modify the phase oscillation of the input signal so that the modified phase oscillation presents more than N phase values, and the modified phase oscillation oscillates in accordance with a second periodicity greater than the first periodicity.

In some embodiments, controlling the at least some of the N samplers to modify the phase oscillation of the input signal comprises controlling the at least some of the N samplers so that: at a first oscillation cycle, the input signal as appearing at a first sampler of the N samplers presents a first phase value, and at a second oscillation cycle subsequent to the first oscillation cycle, the input signal as appearing at the first sampler of the N samplers presents a second phase value different from the first phase value.

In some embodiments, controlling at least some of the N samplers to modify the phase oscillation of the input signal further comprises controlling the at least some of the N samplers so that: at the first oscillation cycle, the input signal as appearing at a second sampler of the N samplers presents a third phase value, and at the second oscillation cycle, the input signal as appearing at the second sampler of the N samplers presents a fourth phase value different from the third phase value.

In some embodiments, a first sampler of the N samplers comprises P switches, wherein P is a positive integer, and wherein controlling the at least some of the N samplers to modify the phase oscillation of the input signal further comprises: at the first oscillation cycle, controlling the first sampler to maintain a first subset of the P switches active.

In some embodiments, controlling at least some of the N samplers to modify the phase oscillation of the input signal further comprises: at the second oscillation cycle, controlling the first sampler to maintain a second subset of the P switches active, the second subset being different from the first subset.

In some embodiments, the second periodicity is at least twice the first periodicity.

In some embodiments, controlling at least some of the N samplers to modify the phase oscillation of the input signal comprises performing a phase permutation of the phase oscillation.

In some embodiments, performing the phase permutation of the phase oscillation comprises performing the phase permutation of the phase oscillation in accordance with a prime number.

In some embodiments, performing the phase permutation of the phase oscillation comprises performing the phase permutation of the phase oscillation in accordance with a random or pseudo-random cadence.

In some embodiments, the control circuitry is configured to clock the N samplers so that each sampler samples the input signal appearing at the input terminal within a different time interval.

Some embodiments relate to a method for controlling a time-interleaved (TI) analog-to-digital converter (ADC), comprising: receiving an input signal at each path of a set of N paths electrically coupled to an input terminal, wherein N is a positive integer, each path comprising a sampler configured to sample the input signal, wherein the N paths result in a phase oscillation of the input signal as appearing at the samplers, wherein the phase oscillation presents at most N phase values, and wherein the phase oscillation oscillates in accordance with a first periodicity; sampling the input signal with each sampler of the N samplers; and controlling at least some of the N samplers to modify the phase oscillation of the input signal so that the modified phase oscillation presents more than N phase values, and the modified phase oscillation oscillates in accordance with a second periodicity greater than the first periodicity.

In some embodiments, controlling the at least some of the N samplers to modify the phase oscillation of the input signal comprises controlling the N samplers so that: at a first oscillation cycle, the input signal as appearing at a first sampler of the N samplers presents a first phase value, and at a second oscillation cycle subsequent to the first oscillation cycle, the input signal as appearing at the first sampler of the N samplers presents a second phase value different from the first phase value.

In some embodiments, controlling the at least some of the N samplers to modify the phase oscillation of the input signal further comprises controlling the N samplers so that: at the first oscillation cycle, the input signal as appearing at a second sampler of the N samplers presents a third phase value, and at the second oscillation cycle, the input signal as appearing at the second sampler of the N samplers presents a fourth phase value different from the third phase value.

In some embodiments, a first sampler of the N samplers comprises P switches, wherein P is a positive integer, and wherein controlling the at least some of the N samplers to modify the phase oscillation of the input signal further comprises: at the first oscillation cycle, controlling the first sampler to maintain a first subset of the P switches active.

In some embodiments, controlling the at least some of the N samplers to modify the phase oscillation of the input signal further comprises: at the second oscillation cycle, controlling the first sampler to maintain a second subset of the P switches active, the second subset being different from the first subset.

In some embodiments, the second periodicity is at least twice the first periodicity.

In some embodiments, controlling the at least some of the N samplers to modify the phase oscillation of the input signal comprises performing a phase permutation of the phase oscillation.

In some embodiments, performing the phase permutation of the phase oscillation comprises performing the phase permutation of the phase oscillation in accordance with a prime number.

In some embodiments, performing the phase permutation of the phase oscillation comprises performing the phase permutation of the phase oscillation in accordance with a random or pseudo-random cadence.

In some embodiments, sampling the input signal with each sampler of the N samplers comprises clocking the N samplers so that each sampler samples the input signal within a different time interval.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 1A is a block diagram of a time interleaved (TI) analog-to-digital converters (ADC) suffering from bandwidth mismatch, in accordance with some embodiments.

FIG. 1B is a plot illustrating clock signals for timing the operation of the TI ADC of FIG. 1A, in accordance with some embodiments.

FIG. 8A is a plot illustrating the amplitude response of a TI ADC before modification using the third example, in accordance with some embodiments.

FIG. 8B is a plot illustrating the amplitude response of a TI ADC after modification using the third example, in accordance with some embodiments.

DETAILED DESCRIPTION

I. Overview

Figure 1C:
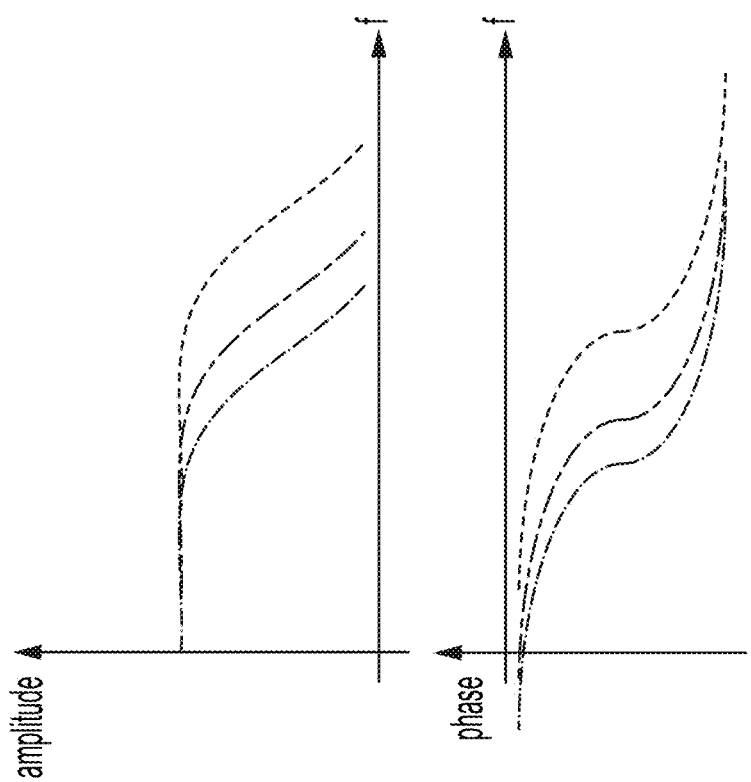
FIG. 1C is a plot illustrating the amplitude response and the phase response associated with some of the paths of the TI ADC of FIG. 1A, in accordance with some embodiments.

The inventor has recognized and appreciated that time interleaved (TI) analog-to-digital converters (ADC) suffer from four types of mismatch—offset mismatch, gain mismatch, time skew mismatch and bandwidth mismatch. Collectively, these phenomena degrade the integrity of the output signal, and as a result, the performance of the TI ADC. The inventor has developed techniques for mitigating bandwidth mismatch, the type of mismatch that affects the integrity of the output signal the most in most circumstances.

Bandwidth mismatch occurs because the paths that connect the input terminal of a TI ADC to the various samplers present different time constants (e.g., RC). In some circumstances, the major contributor is the fact that the sampling switches present different values of resistance and/or capacitance. Bandwidth mismatch results in a phase oscillation across the input terminals of the samplers. The phase oscillation, in turn, gives rise to spurious tones in the spectral response of the converter that are substantially above the noise floor. The presence of these tones may be unacceptable in some contexts (e.g., in high-end instrumentations, Radar and Lidar, and wireless infrastructure).

The techniques developed by the inventor and described herein involve spreading the energy associated with the spurious tones across the frequency spectrum, thereby reducing the overall impact of individual tones. In some embodiments, for example, the tones may disappear under the noise floor. Spreading the energy associated with the spurious tones can be achieved by increasing the periodicity of the phase oscillation. This, in turn, can be achieved by introducing, in the phase oscillation, artificial phase shifts in addition to the phase shifts arising due to bandwidth mismatch. In one example, increasing the periodicity of a phase oscillation from 4 phase samples to 8 phase samples can result in a reduction in the power of a tone as high as 7 dB.

II. Bandwidth Mismatch

Bandwidth mismatch is a result of the fact that the paths that connect the input terminal of a TI ADC to the various samplers inevitably present different time constants. FIG. 1 is a block diagram illustrating a TI ADC that suffers from bandwidth mismatch. TI ADC 100 includes an input buffer 102, an input terminal 104, and a plurality of paths (four paths in this example, though more or fewer paths are also possible). Each path includes a sampler 106 and multiple ADCs 108 connected to the sampler. For example, path 105 includes a sampler 106 and ADCs $108_1$, $108_2$ and $108_3$. Having multiple paths each including multiple ADCs enables the TI ADC to sample signals at rates beyond what is possible with conventional ADCs. In this example, the input voltage appearing at the input terminal 104 is voltage $V_{in}$. Control circuitry 110 generates the clock signals (ck1, ck2, ck3 and ck4) used to time the operation of TI ADC 100. Examples of the clock signals are illustrated in FIG. 1B. Here, a clock having a high value indicates that the corresponding sampler 106 is supposed to sample the input signal. By contrast, a clock having a low value indicates that the corresponding sampler 106 is not supposed to sample the input signal. Other logics are also possible. As can be appreciated from FIG. 1B, control circuitry 110 controls the TI ADC so that each sampler samples the input signal at a different time interval, thus providing the desired time interleaving effect that enables higher sampling rates.

Referring back to FIG. 1A, each path presents a certain resistance and capacitance, which results from the combination of the resistance and capacitance of the conductive traces and the input resistance of the samplers. In theory, the TI ADC is designed so that the resistances and capacitances of the various paths are perfectly matched. In practice, however, the resistances and/or capacitance are slightly mismatched due to inevitable variations in the manufacturing processes. Variations in the input resistance and/or capacitance of the samplers can be particularly serious. In some circumstances, even the slightest variation in input resistance or capacitance (e.g., in the order of 0.5%) can produce unacceptable results.

Figure 1D:
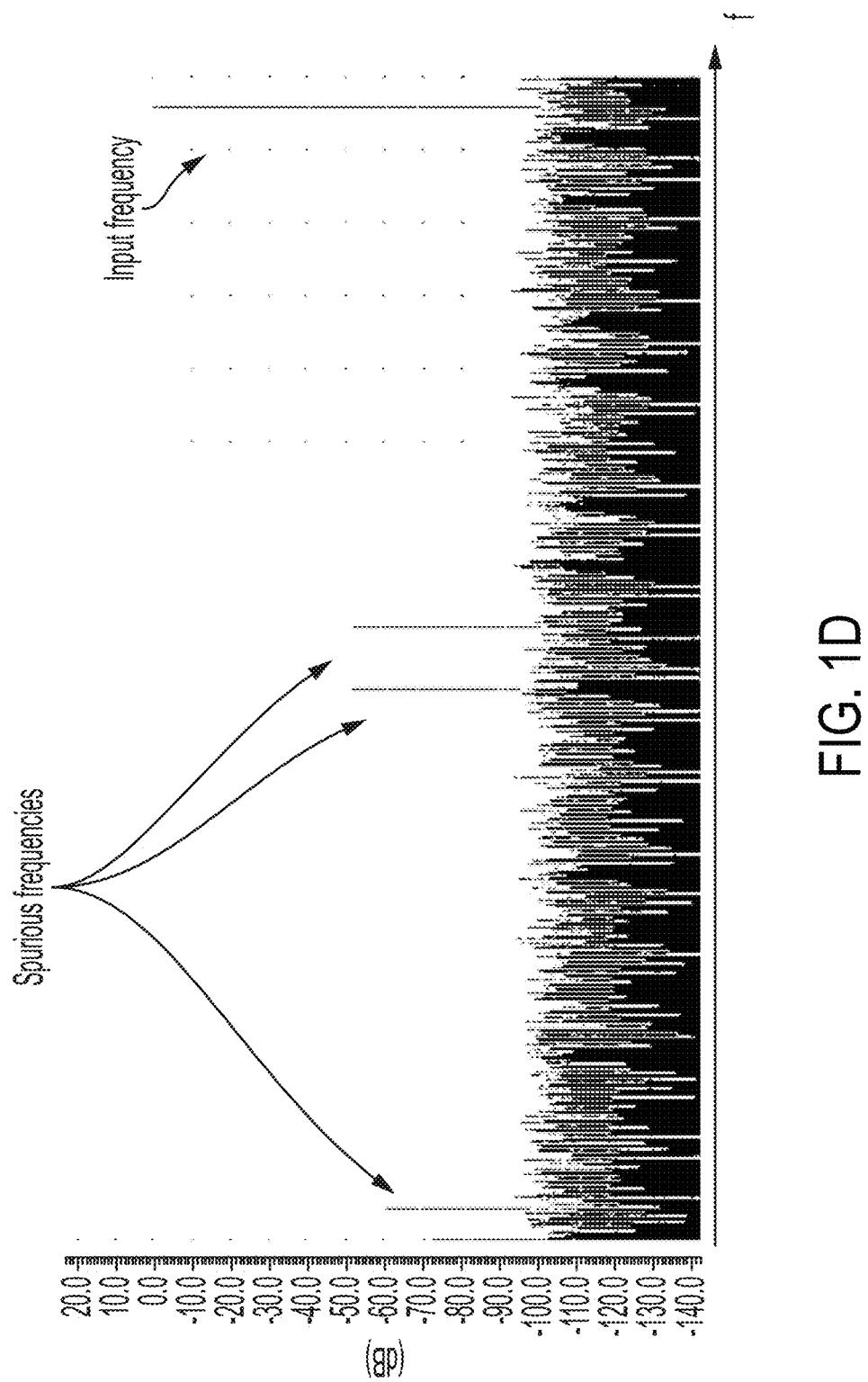
FIG. 1D is a plot illustrating the amplitude response associated with the TI ADC of FIG. 1A, in accordance with some embodiments.

The variations in resistance and capacitance described above are what causes bandwidth mismatch. As a result, each path exhibits a different frequency response to input signals. FIG. 1C is a plot illustrating the amplitude response and the phase response associated with some of the paths of the TI ADC of FIG. 1A. These plots illustrate the amplitude response and phase response of three representative paths of the four paths of FIG. 1A. As can be appreciated from the top plot, each path exhibits a different frequency bandwidth. Further, as can be appreciated from the bottom plot, each path exhibits a different frequency at which the convexity of the corresponding phase is inverted. Collectively, these effects result in the formation of spurious tones, although the impact of the phase response tends to be larger than the impact of the amplitude response because, at least in some embodiments, the sampling rate of one sampler (e.g., 10 GHz) is lower than the cut-off frequency of the path (e.g., 25 GHz). Examples of these tones are depicted in FIG. 1D. In this example, although the input signal exhibits a single frequency tone (the input frequency), the signal spectrum further exhibits spurious tones, which arise due to the differences in the frequency responses shown in FIG. 1C. These tones can seriously degrade the performance of the TI ADC.

Figure 2A:
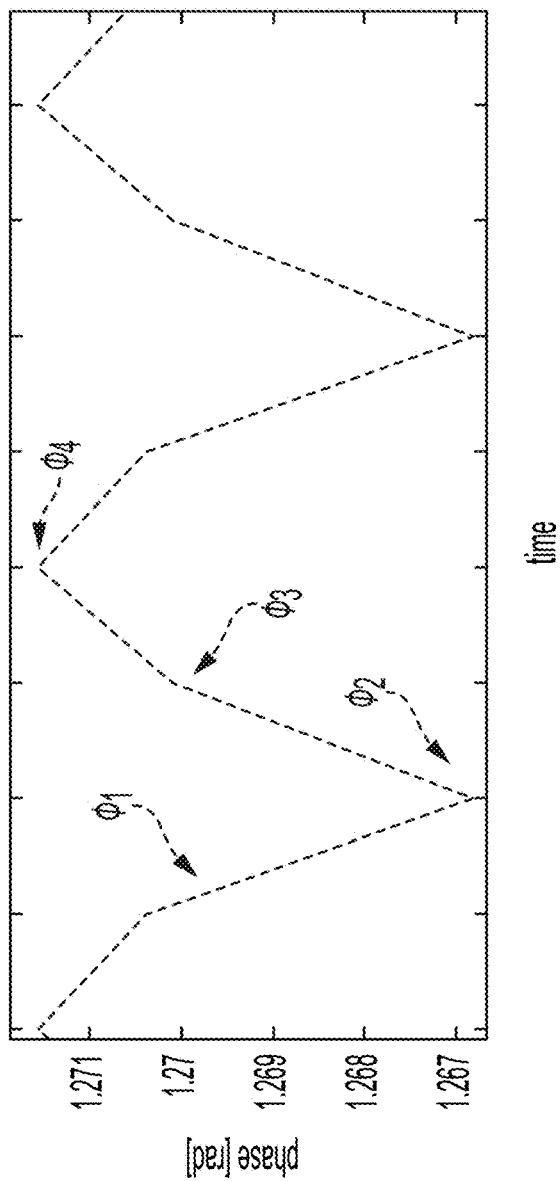
FIG. 2A is a plot illustrating a phase oscillation associated with the TI ADC of FIG. 1A, in accordance with some embodiments.

The mismatch in the amplitude and phase responses associated with the different paths gives rise to a phase oscillation. FIG. 2A is a plot that illustrates how the phase of the TI ADC of FIG. 1A varies over time. As can be appreciated from this figure, the overall phase associated with the signals appearing at the inputs the samplers presents a cyclical behavior. Here, the TI ADC oscillates in accordance with the following values: $\Phi 1$, $\Phi 2$, $\Phi 3$ and $\Phi 4$. $\Phi 1$ represents the phase associated with the first path of the TI ADC, $\Phi 2$ represents the phase associated with the second path, $\Phi 3$ represents the phase associated with the third path, and $\Phi 4$ represents the phase associated with the fourth path. The phase shown in FIG. 2A oscillates because, as different samplers are activated in a sequential fashion, the phase of the currently activated sampler is switched from one value to another. In essence, as further shown in FIG. 2B, the phase cycles in accordance with the following sequence: $\Phi 1$, $\Phi 2$, $\Phi 3$, $\Phi 4$, $\Phi 1$, $\Phi 2$, $\Phi 3$, $\Phi 4$, $\Phi 1$, $\Phi 2$, $\Phi 3$, $\Phi 4$ .... Here, the periodicity of the phase oscillation is four samples. Every four samples, the phase oscillation repeats itself. It is this phase oscillation that creates the spurious tones illustrated in FIG. 1D.

III. Mitigation of Bandwidth Mismatch

Described herein are techniques for mitigating bandwidth mismatch in TI ADCs. In some embodiments, this may be accomplished by spreading the energy associated with the spurious tones across the frequency spectrum. In this way, the overall impact of each individual tone is reduced substantially. In some embodiments, for example, the tones may disappear under the noise floor. Spreading the energy associated with the spurious tones can be achieved by increasing the periodicity of the phase oscillation discussed above. This, in turn, can be achieved by introducing artificial phase shifts in addition to the phase shifts arising due to bandwidth mismatch.

In one example, a TI ADC has a set of N paths electrically coupled to the input terminal (e.g., four paths in the example of FIG. 1A). The N paths result in a phase oscillation of the input signal as appearing at the samplers, where the phase oscillation presents at most N phase values (e.g., Φ1, Φ2, Φ3, Φ4). The phase oscillation oscillates in accordance with a first periodicity (a periodicity of four phase values in the example of FIG. 1A). The techniques described herein involve controlling at least some of the N samplers to modify the phase oscillation of the input signal so that the modified phase oscillation presents more than N phase values. As a result, the modified phase oscillation oscillates in accordance with a second periodicity greater than the first periodicity (e.g., a periodicity greater than four phase values).

Figure 3A:
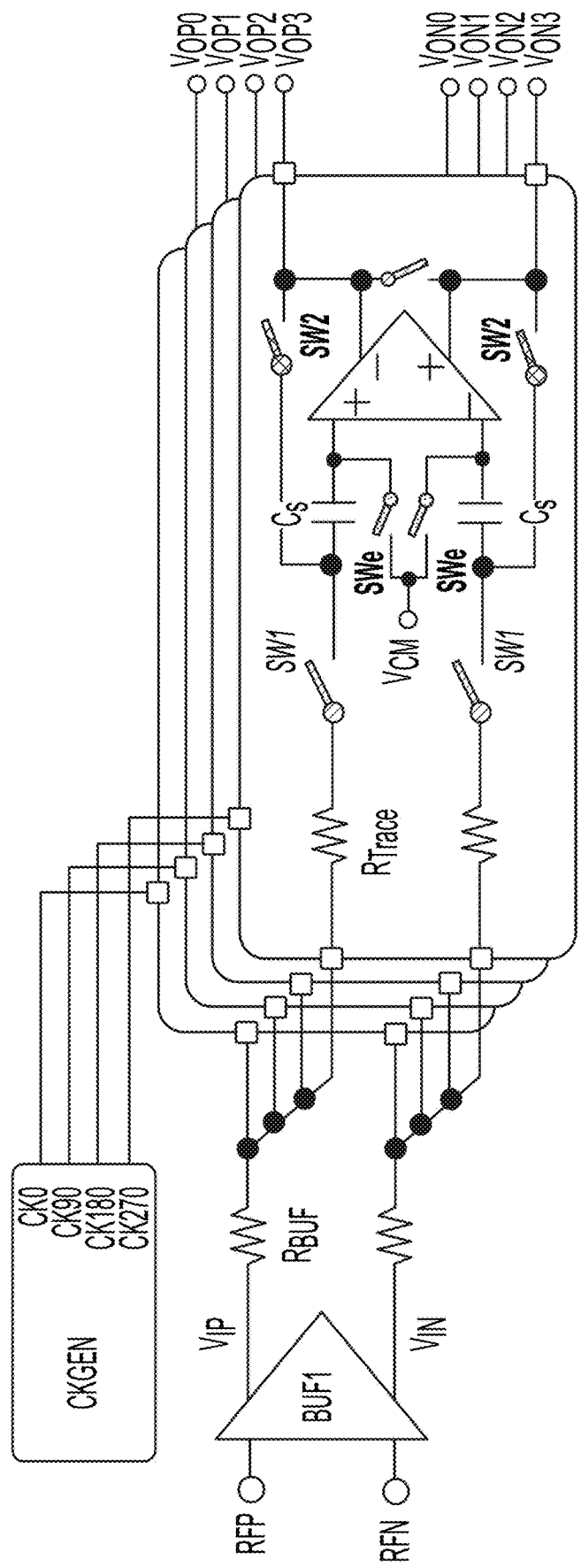
FIG. 3A is a block diagram of a differential TI ADC configured to mitigate bandwidth mismatch, in accordance with some embodiments.
Figure 3C:
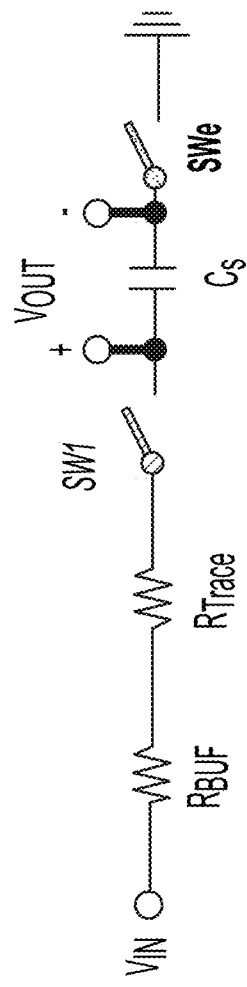
FIG. 3C is a block diagram of a single-ended TI ADC configured to mitigate bandwidth mismatch, in accordance with some embodiments.
Figure 3B:
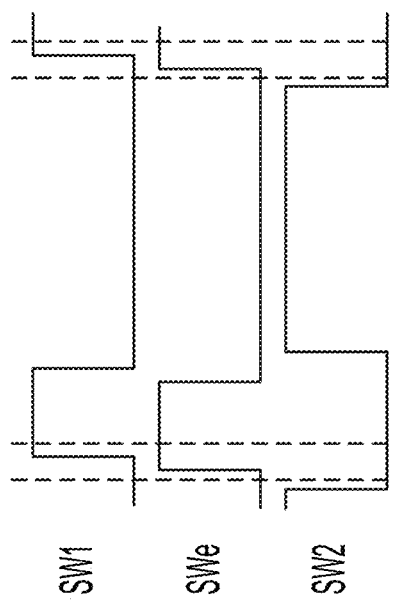
FIG. 3B is a plot illustrating control signals for timing the operation of the TI ADC of FIG. 3A, in accordance with some embodiments.

FIG. 3A is a block diagram of a differential TI ADC arranged in this manner. Each path of the TI ADC includes a pair of switches SW1, a pair of switches SW2, switches SWe and a pair of sampling capacitors Cs. The timing with which the switches are activated and deactivated in some embodiments is illustrated in FIG. 3B. The signals depicted in FIG. 3B dictate the sample and hold operation of the TI ADC. FIG. 3C represents a single-ended implementation of a path of the TI ADC. The timing of the sampling is determined by the opening of the switches SWe. The main source of bandwidth mismatch is the on-resistance of the switches SW1, tied to a terminal of sampling capacitors Cs.

Figure 4B:
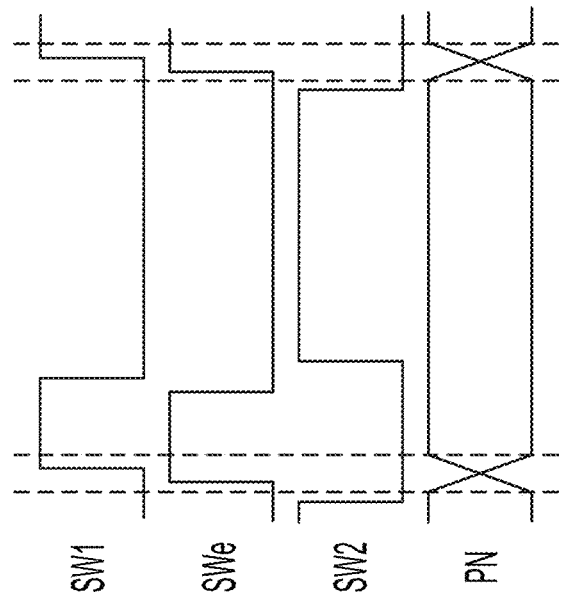
FIG. 4B is a plot illustrating control signals for timing the operation of the TI ADC of FIG. 4A, in accordance with some embodiments.
Figure 4A:
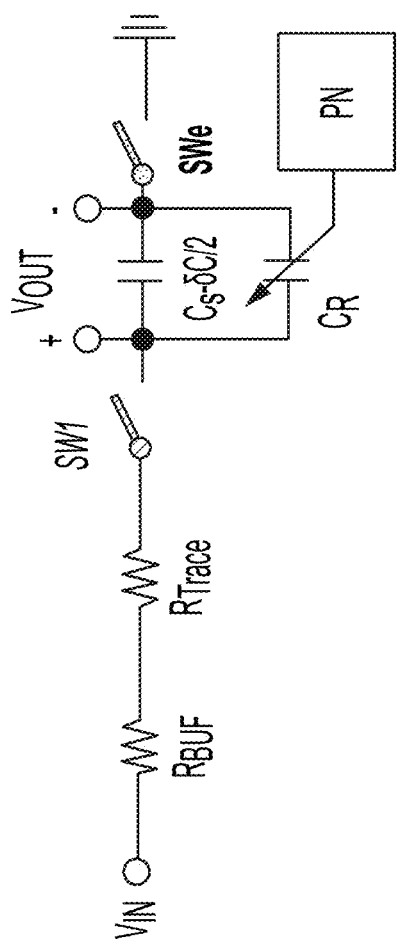
FIG. 4A is a block diagram illustrating a pseudo random noise generator in addition to the single-ended TI ADC of FIG. 3C, in accordance with some embodiments.

In some embodiments, increasing the periodicity of the phase oscillation from the first periodicity to the second periodicity can be accomplished by introducing additional capacitors in parallel to the capacitors Cs, and by varying the capacitances of these additional capacitors in accordance with random or pseudo random codes (thereby changing the time constant RC). FIG. 4A illustrates a diagram of a TI ADC path having one such parallel capacitor (Cr), the capacitance of which is set by a pseudo random noise generator (PN). FIG. 4B is a plot illustrating control signals for timing the operation of the circuit of FIG. 4A. In accordance with the plot of FIG. 4B, the total value of the sampling capacitor Cs of each of path can be adjusted. The total value of Cs is changed frequently, possibly each time a new sample is captured as depicted in FIG. 4B. However, in some embodiments, a sampling capacitor Cs need not be updated whenever a new sample is captured. Thus, when Cs is varied, the corresponding bandwidth mismatch varies accordingly, and the original periodic sequence of fixed bandwidth mismatches is replaced by a random sequence of ever-changing bandwidth mismatches. As a result, correlation among the sampled input waveform is reduced, thus substantially improving the spurious free dynamic range (SFDR) of the TI ADC.

In some embodiments, the total sampling capacitance can be realized by shunting a main sampling capacitor (having capacitance of Cs−δC/2 (slightly smaller than the original Cs), with an additional small capacitor Cr the value of which is varied by the random digital code PN. Here, δC determines the desired range of capacitance variation. The nominal value of Cr can be made adjustable from 0 to δC. As result, the total value of the sampling capacitance can be varied between Cs−δC/2 and CS+δC/2.

Figure 4C:
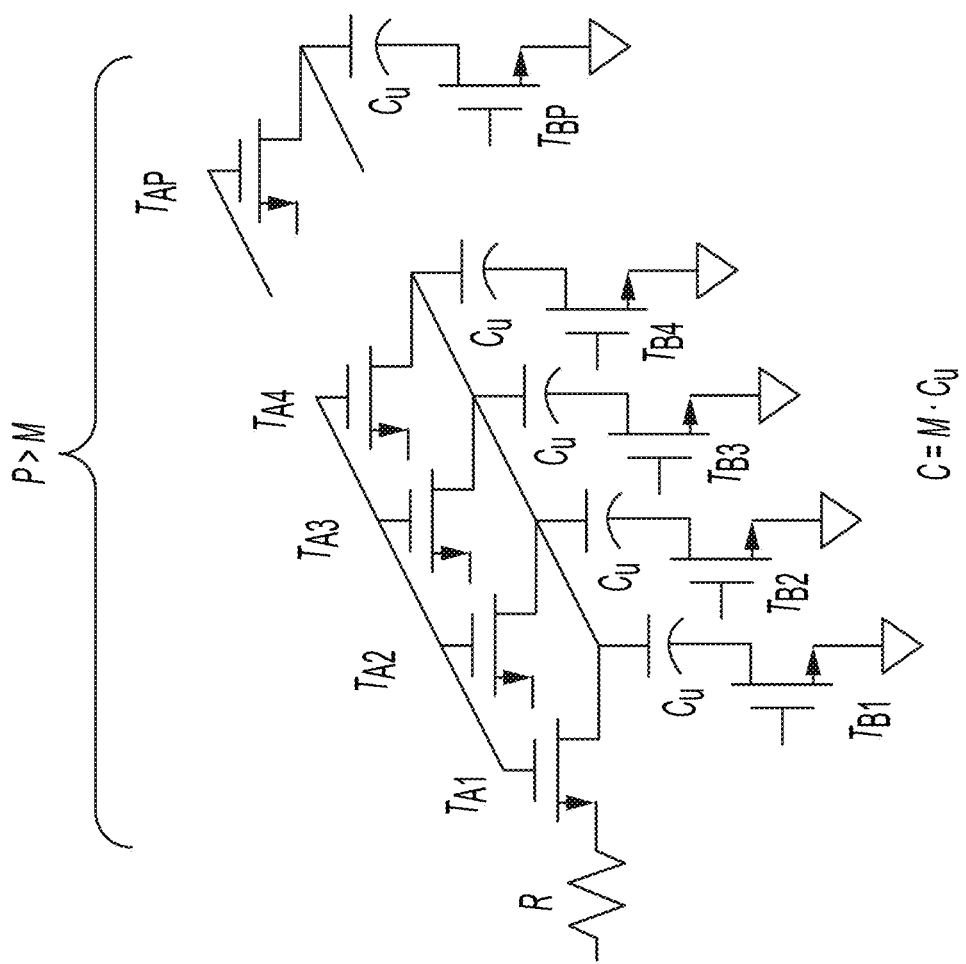
FIG. 4C is a diagram illustrating a circuit for varying the capacitance of a sampler, in accordance with some embodiments.

In some embodiments, varying the capacitance of a sampler may involve providing a sampler with multiple capacitors, and activating only sub-sets of these capacitors in a randomized (or pseudo-randomized) fashion. FIG. 4C is a diagram illustrating a circuit for varying the capacitance of a sampler, in accordance with some embodiments. In this example, a sampler includes P capacitors Cu, which are connected/disconnected from resistor R depending on the state of the corresponding transistors $T_{A1}$, $T_{A2}$, $T_{A3}$, $T_{A4}$ and $T_{AP}$, and are connected/disconnected from ground depending on the state of the corresponding transistors $T_{B1}$, $T_{B2}$, $T_{B3}$, $T_{B4}$ and $T_{BP}$. In some embodiments, only a sub-set of M (<P) capacitors are activated, thereby providing an overall capacitance $C=M\times C_u$. By varying which M capacitors are activated in a randomized (or pseudo-randomized) fashion, capacitance C can be randomized.

A. EXAMPLE 1

Figure 2B:
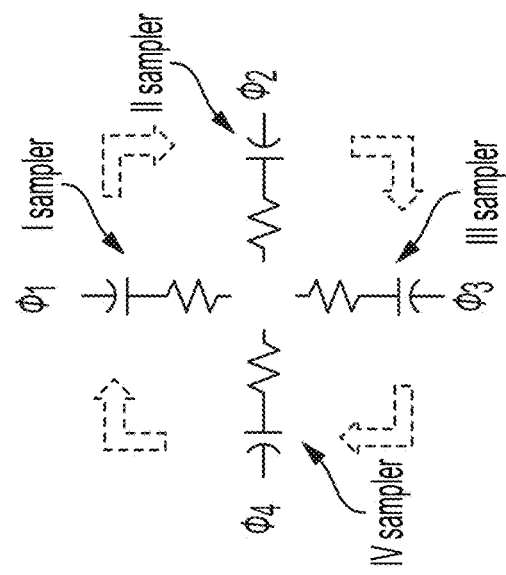
FIG. 2B is a plot illustrating how the phase of the input signal jumps between different paths of the TI ADC of FIG. 1A, in accordance with some embodiments.
Figure 5B:
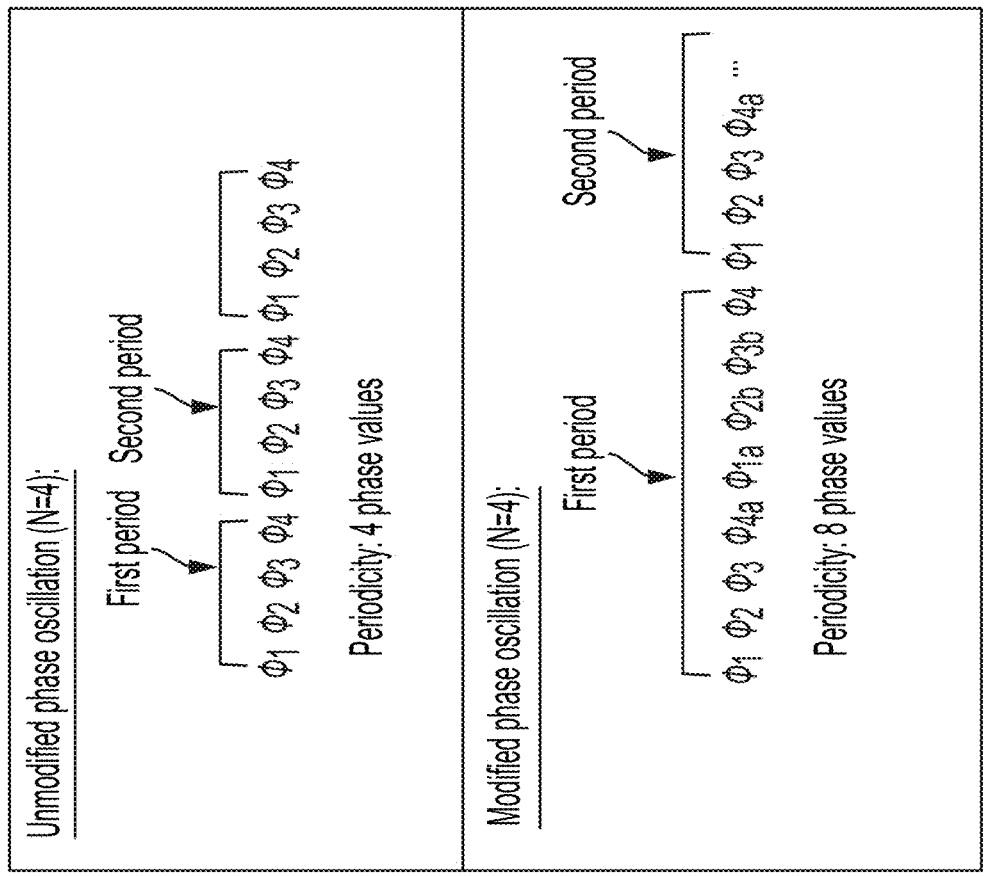
FIG. 5B illustrates the periodicity of a phase oscillation before and after modification using a first example, in accordance with some embodiments.
Figure 5A:
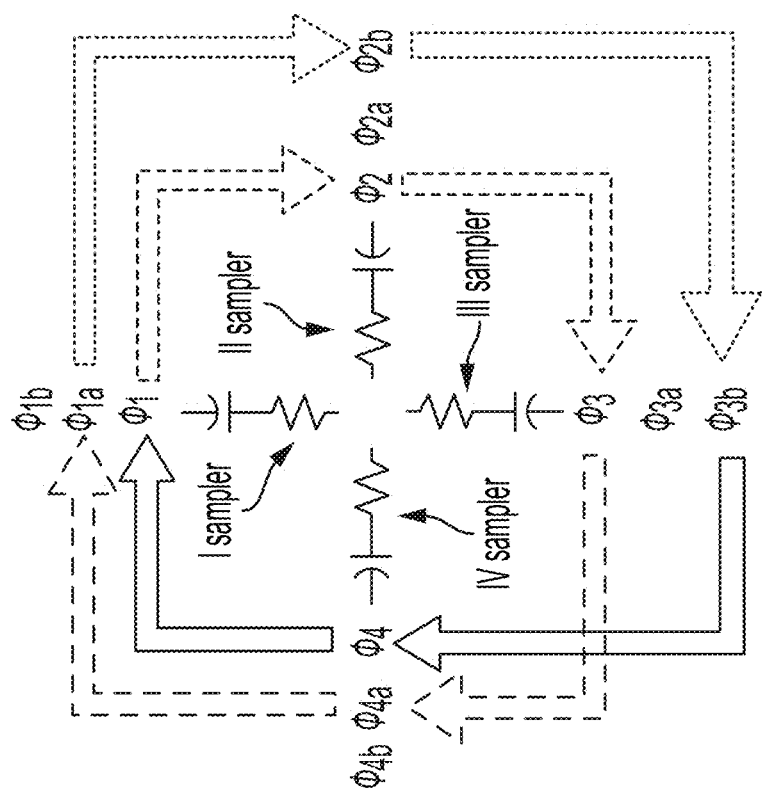
FIG. 5A is a plot illustrating a technique for extending the periodicity of a phase oscillation, in accordance with some embodiments.

In some embodiments, varying the sampling capacitors results in an increase of the periodicity of the phase oscillation. An example of this result is depicted in FIG. 5A. Initially, the phase oscillation proceeds as in the example of FIG. 2B: the first phase value of the oscillation is Φ1, the second phase value of the oscillation is Φ2, and the third phase value of the oscillation is Φ3. Subsequently, instead of proceeding to Φ4 as shown in FIG. 2B, the phase oscillation of FIG. 5A proceeds to phase value Φ4a, where Φ4a is different from Φ4. This can be accomplished by varying the capacitance of the fourth sampling capacitor from its nominal value. Then, the phase oscillation proceeds to phase value Φ1a, where Φ1a is different from Φ1. This can be accomplished by varying the capacitance of the first sampling capacitor from its nominal value. Then, the phase oscillation proceeds to phase value Φ2b, where Φ2b is different from Φ2. This can be accomplished by varying the capacitance of the second sampling capacitor from its nominal value. Then, the phase oscillation proceeds to phase value Φ3b, where Φ3b is different from Φ3. This can be accomplished by varying the capacitance of the third sampling capacitor from its nominal value. Lastly, the phase oscillation proceeds to phase value Φ4. This can be accomplished by setting the capacitance of the fourth sampling capacitor back to its nominal value. The phase oscillation then repeats itself. FIG. 5B provides a comparison between two TI ADCs each having four paths. In the top panel, the phase oscillation is unmodified and presents a periodicity of four phase values. In the bottom panel, the phase oscillation is modified in accordance with the scheme of FIG. 5A, and as a result presents a periodicity of eight phase values.

Figure 5C:
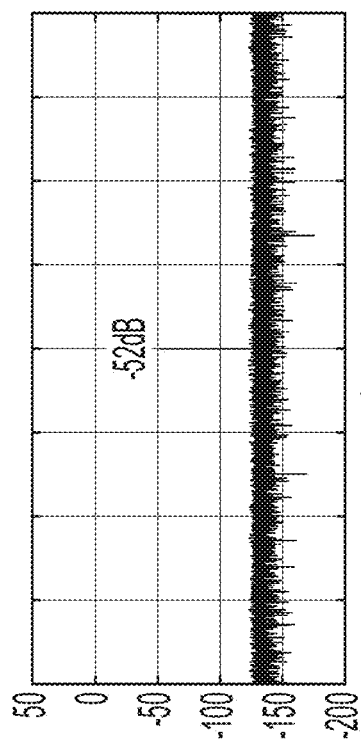
FIG. 5C is a plot illustrating a phase oscillation before modification using the first example, in accordance with some embodiments.
Figure 5D:
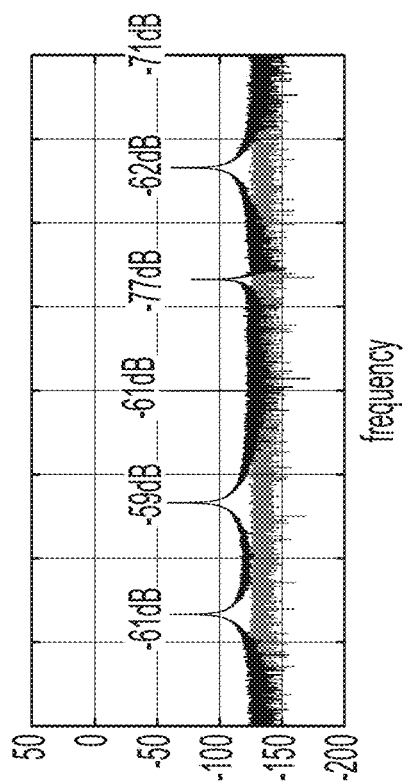
FIG. 5D is a plot illustrating an amplitude response associated with the phase oscillation of FIG. 5C, in accordance with some embodiments.
Figure 5E:
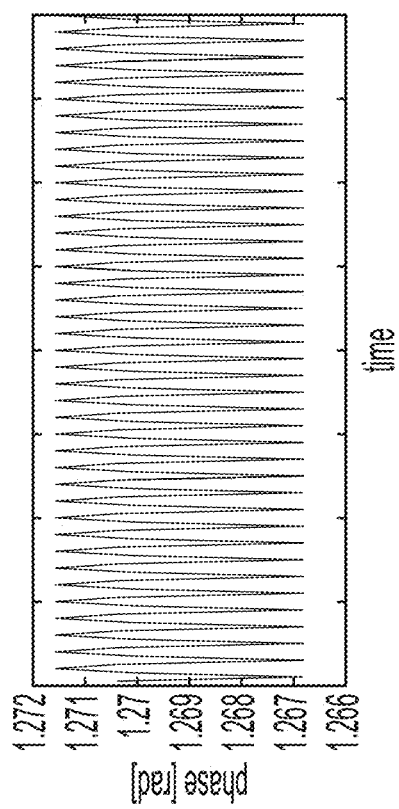
FIG. 5E is a plot illustrating a phase oscillation after modification using the first example, in accordance with some embodiments.
Figure 5F:
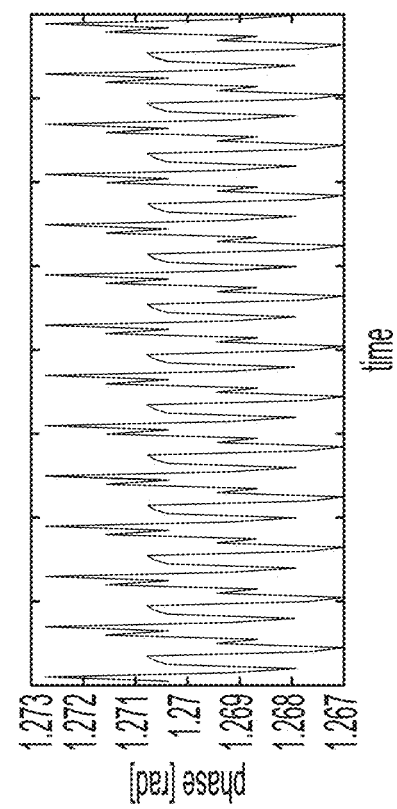
FIG. 5F is a plot illustrating an amplitude response associated with phase oscillation after modification using the first example, in accordance with some embodiments.

FIG. 5C is a plot illustrating how the unmodified phase oscillation varies over time, and FIG. 5D is a plot illustrating the corresponding spectrum. In this example, the phase oscillation gives rise to a spurious tone having an amplitude (−52 dB) several orders of magnitude above the noise floor. By contrast, FIG. 5E is a plot illustrating the phase of the oscillation when modified in accordance with the sequence of FIG. 5B. FIG. 5F is a plot illustrating the corresponding spectrum. As can be appreciated by comparing FIG. 5C with FIG. 5E, the modified phase oscillation deviates from a sinusoidal oscillation to a greater extent than the unmodified oscillation does. The result is that the energy of the spurious tone shown in FIG. 5D is spread among several additional tones not otherwise present in the unmodified case. Each tone of FIG. 5F has an amplitude that is significantly lower than the amplitude of the tone of FIG. 5D, thus reducing the negative effects of bandwidth mismatch on the performance of the TI ADC. The tone with the largest amplitude is 7 dB less than the tone of FIG. 5D.

B. EXAMPLE 2

In another example, the sequence of phase values appearing at the samplers may be varied in accordance with permutations of prime numbers. For instance, the sequence may be altered every five samples (five is a prime number).

Figure 6A:
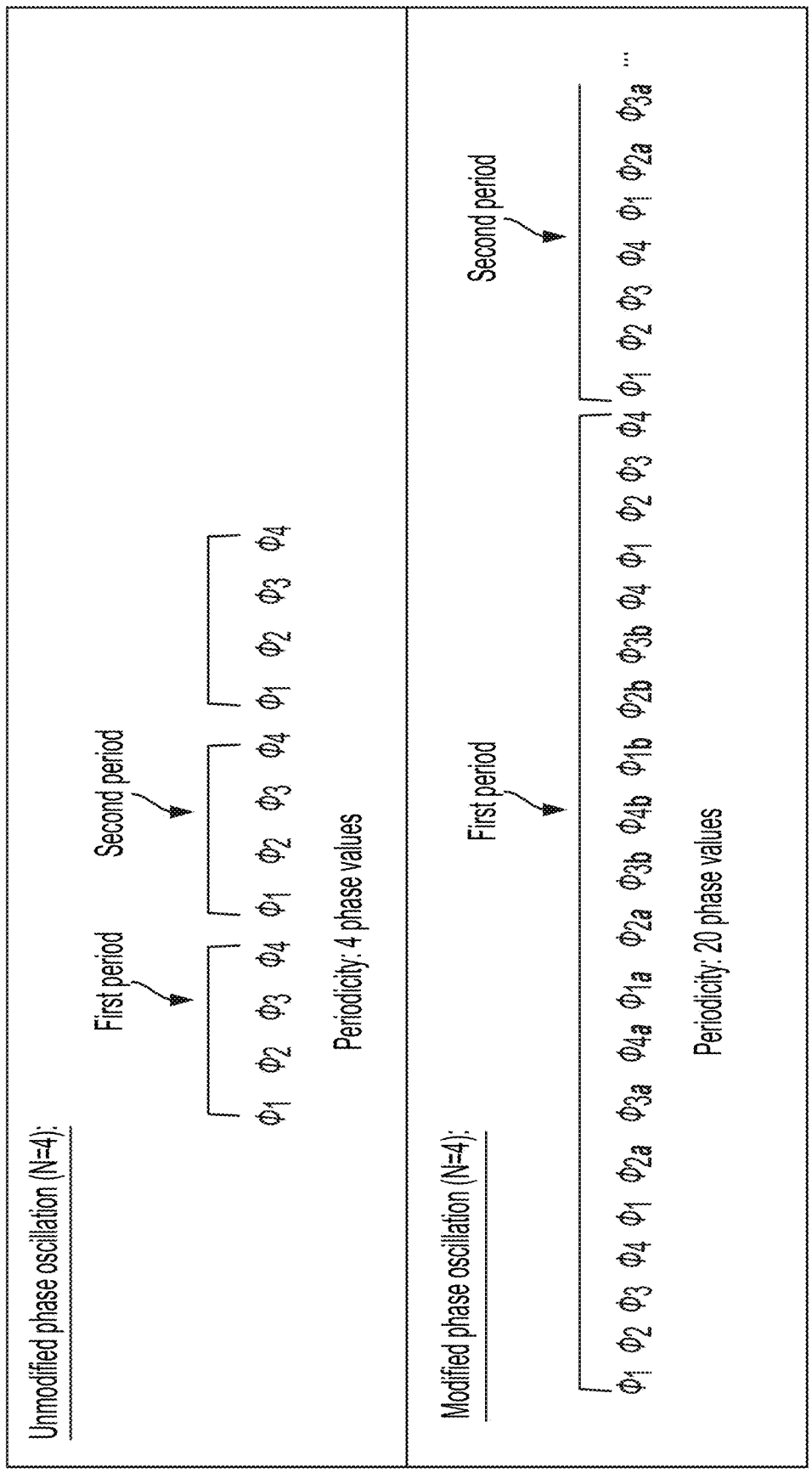
FIG. 6A illustrates the periodicity of a phase oscillation before and after modification using a second example, in accordance with some embodiments.

The inventor has appreciated that by varying the phase sequence in accordance with permutations of prime numbers leads to larger periodicities. The result is that the energy of a spurious tone is spread to an even greater extent. FIG. 6A illustrates the periodicity of a phase oscillation before and after modification using a permutation of a prime number, in accordance with some embodiments. In this example, the periodicity is increased from four phase values (in the unmodified case) to twenty phase values (in the modified case).

Figure 6C:
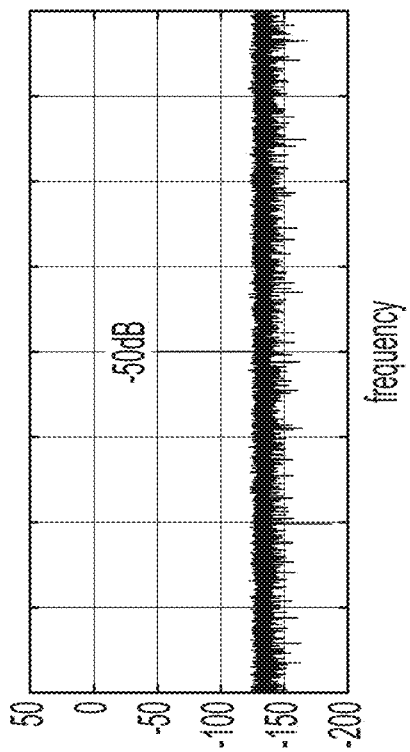
FIG. 6C is a plot illustrating an amplitude response associated with the phase oscillation of FIG. 6B, in accordance with some embodiments.
Figure 6B:
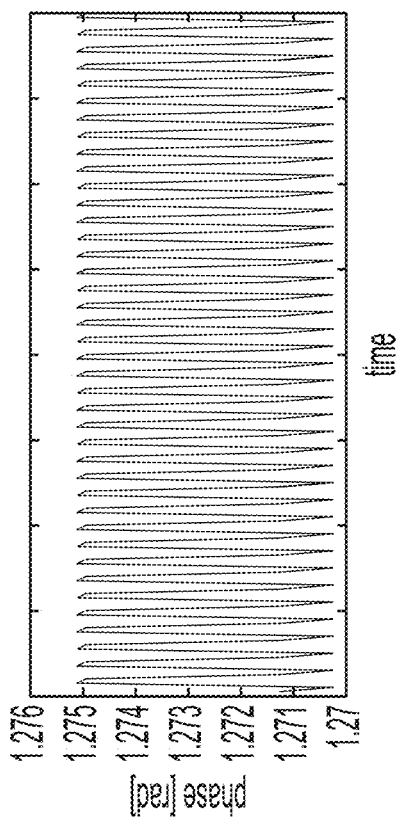
FIG. 6B is a plot illustrating a phase oscillation before modification using the second example, in accordance with some embodiments.
Figure 6E:
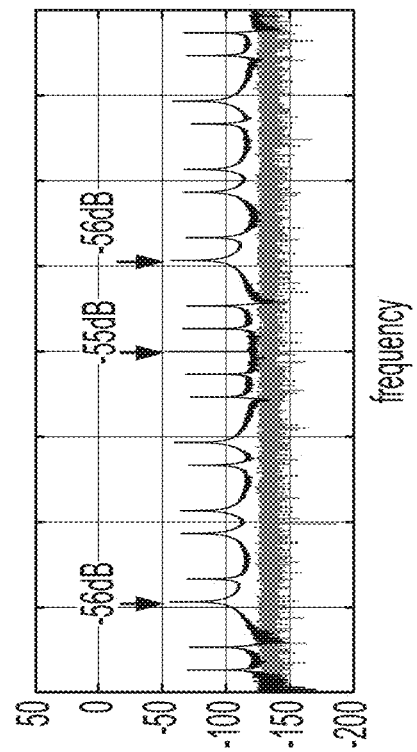
FIG. 6E is a plot illustrating an amplitude response associated with phase oscillation after modification using the second example, in accordance with some embodiments.
Figure 6D:
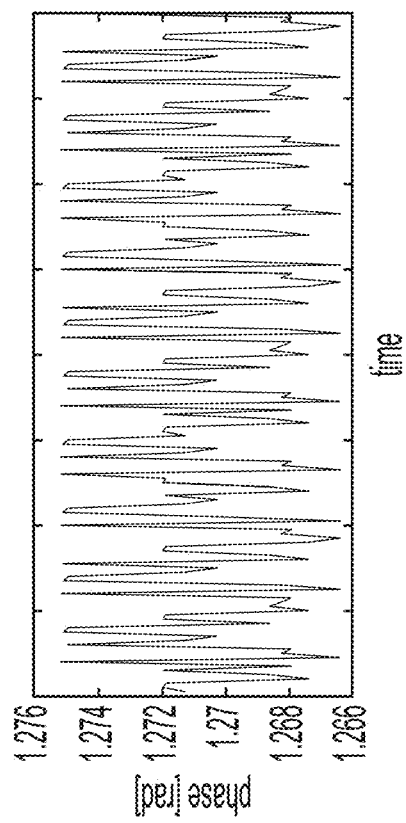
FIG. 6D is a plot illustrating a phase oscillation after modification using the second example, in accordance with some embodiments.

FIG. 6B is a plot illustrating how the unmodified phase oscillation varies over time, and FIG. 6C is a plot illustrating the corresponding spectrum. In this example, the phase oscillation gives rise to a spurious tone having an amplitude of −50 dB. By contrast, FIG. 6D is a plot illustrating the phase of the oscillation when modified in accordance with the sequence of FIG. 6A. FIG. 6E is a plot illustrating the corresponding spectrum. As can be appreciated by comparing FIG. 6C with FIG. 6E, the energy of the spurious tone shown in FIG. 6C is spread among several additional tones. Each tone of FIG. 6E has an amplitude that is significantly lower than the amplitude of the tone of FIG. 6C, thus reducing the negative effects of bandwidth mismatch on the performance of the TI ADC. The tone with the largest amplitude is 5 dB less than the tone of FIG. 6C.

C. EXAMPLE 3

Figure 7A:
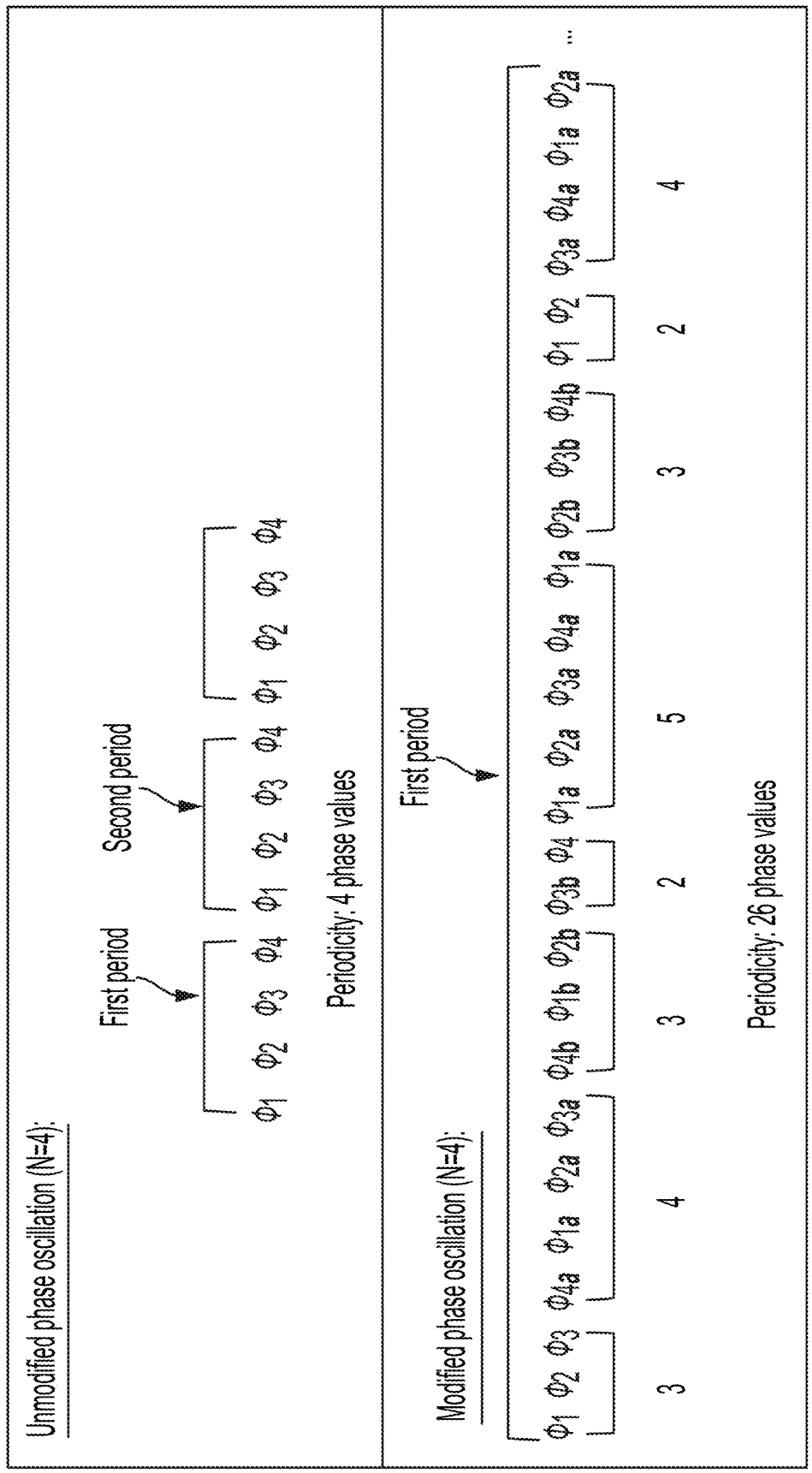
FIG. 7A illustrates the periodicity of a phase oscillation before and after modification using a third example, in accordance with some embodiments.

In yet another example, the sequence of phase values appearing at the samplers may be varied in accordance with a random or pseudo-random cadence. For instance, the sequence may be altered every five samples at one cycle, every three samples at the following cycle, every four samples at the following cycles, etc. The inventor has appreciated that by varying the phase sequence in accordance with a random or pseudo-random cadence leads to even larger periodicities than what is shown in the previous examples. The result is that the energy of a spurious tone is spread to an even greater extent. FIG. 7A illustrates the periodicity of a phase oscillation before and after modification using a random or pseudo-random cadence, in accordance with some embodiments. In this example, the periodicity is increased from four phase values (in the unmodified case) to twenty-six phase values (in the modified case).

Figure 7B:
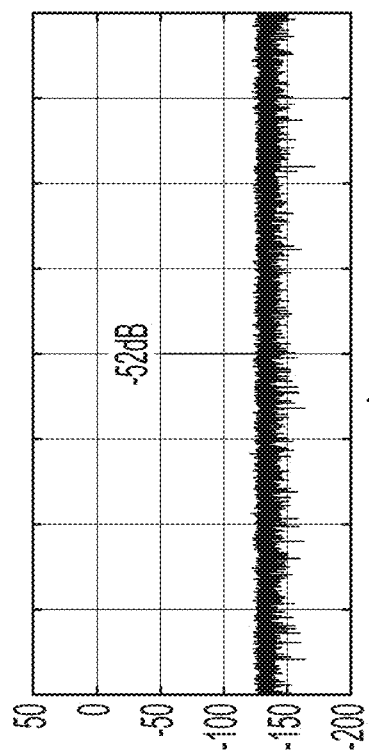
FIG. 7B is a plot illustrating a phase oscillation before modification using the third example, in accordance with some embodiments.
Figure 7C:
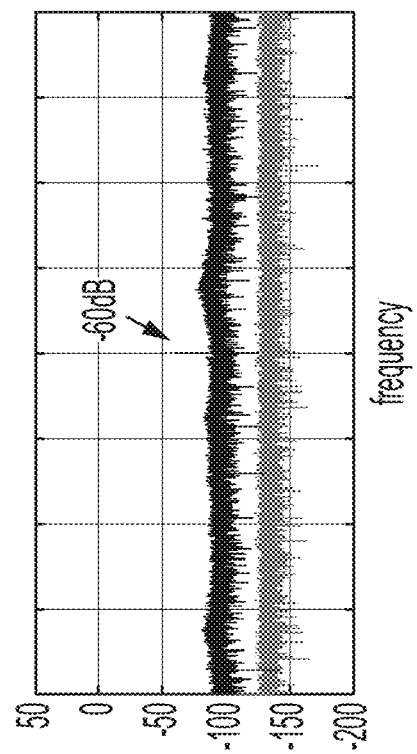
FIG. 7C is a plot illustrating an amplitude response associated with the phase oscillation of FIG. 7B, in accordance with some embodiments.
Figure 7D:
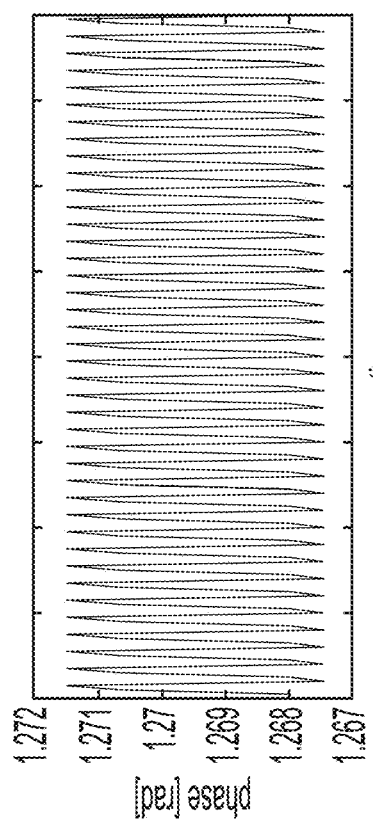
FIG. 7D is a plot illustrating a phase oscillation after modification using the third example, in accordance with some embodiments.
Figure 7E:
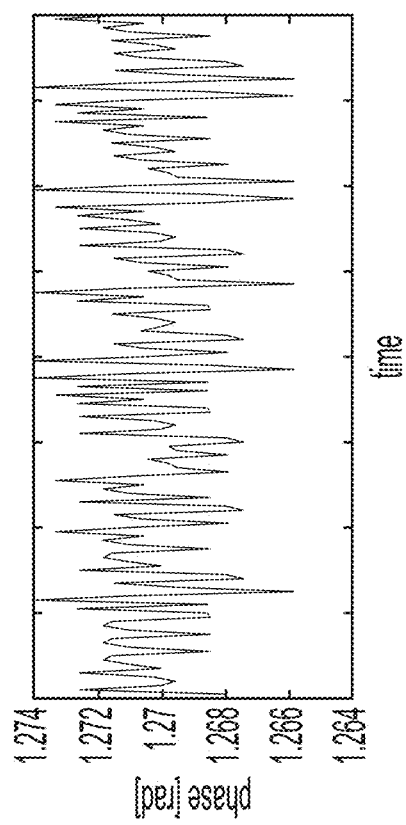
FIG. 7E is a plot illustrating an amplitude response associated with phase oscillation after modification using the third example, in accordance with some embodiments.

FIG. 7B is a plot illustrating how the unmodified phase oscillation varies over time, and FIG. 7C is a plot illustrating the corresponding spectrum. In this example, the phase oscillation gives rise to a spurious tone having an amplitude of −52 dB. By contrast, FIG. 7D is a plot illustrating the phase of the oscillation when modified in accordance with the random cadence of FIG. 7A. FIG. 7E is a plot illustrating the corresponding spectrum. As can be appreciated by comparing FIG. 7C with FIG. 7E, the energy of the spurious tone shown in FIG. 7C is spread among so many new tones that the majority of the tones that arise as a result disappears under the noise floor. This occurs because of the random (or pseudo-random) nature of the scrambling process used in Example 3. The result is that the noise floor is raised. Some tones may still lie above the noise floor, but their amplitude is substantially reduced. For example, the amplitude of the largest tone is −60 dB, which represents an 8 dB improvement over FIG. 7C.

FIGS. 8A and 8B are plots illustrating the amplitude response of a TI ADC before and after modification using the third example, respectively. More specifically, the plots represent the ADC's SFDR as a function of frequency. The unmodified scenario presents tones with an SFDR of about 60 dBFS. Upon application of the technique described in accordance with the third example, the majority of the energy is spread across so many new tones that the energy of these tones disappears under the noise floor. As a result, the noise floor raises. Here, the largest tones have an SFDR of 70 dBFS, representing a 10 dB improvement over FIG. 8A.

VI. CONCLUSION

Accordingly, some embodiments relate to a TI ADC including a set of N paths electrically coupled to an input terminal (e.g., terminal 104). Each path includes a sampler (e.g., sampler 106) configured to sample an input signal (e.g., Vin) appearing at the input terminal. Due to bandwidth mismatch, the N paths result in a phase oscillation of the input signal as appearing at the samplers, where the phase oscillation presents at most N phase values. For example, the phase oscillation may present four phase values or less where the TI ADC includes four paths as illustrated in the example of FIG. 1A. The phase oscillation oscillates in accordance with a first periodicity (e.g., four phase values in the example of FIG. 2A). Control circuitry is configured to control at least some of the N samplers to modify the phase oscillation of the input signal so that the modified phase oscillation presents more than N phase values. For example, the unmodified phase oscillation may present four phase values and the modified phase oscillation may present eight phase values, twenty phase values or twenty-six phase values, among a few possible examples. Accordingly, the modified phase oscillation oscillates in accordance with a second periodicity greater than the first periodicity. This increase in the periodicity of the phase oscillation spreads the energy of spurious tones across the frequency spectrum.

In some embodiments, at a first oscillation cycle, the input signal as appearing at a first sampler of the N samplers presents a first phase value (e.g., $\Phi 1$ as shown at the bottom panel of FIG. 5B), and, at a second oscillation cycle subsequent to the first oscillation cycle, the input signal as appearing at the first sampler of the N samplers presents a second phase value (e.g., $\Phi 1a$ as shown at the bottom panel of FIG. 5B) different from the first phase value.

Further, in some embodiments, at the first oscillation cycle, the input signal as appearing at a second sampler of the N samplers presents a third phase value (e.g., $\Phi 2$ as shown at the bottom panel of FIG. 5B), and, at the second oscillation cycle, the input signal as appearing at the second sampler of the N samplers presents a fourth phase value (e.g., $\Phi 2b$ as shown at the bottom panel of FIG. 5B) different from the third phase value.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±10% of a target value in some embodiments. The terms "approximately" and "about" may include the target value.

What is claimed is:

1. A time-interleaved (TI) analog-to-digital converter (ADC), comprising:
    an input terminal;
    a set of N paths electrically coupled to the input terminal, each path comprising a sampler configured to sample an input signal appearing at the input terminal, wherein N is a positive integer, wherein the N paths result in a phase oscillation of the input signal as appearing at the samplers, wherein the phase oscillation presents at most N phase values, and wherein the phase oscillation oscillates in accordance with a first periodicity; and
    control circuitry configured to control at least some of the N samplers to modify the phase oscillation of the input signal so that the modified phase oscillation presents more than N phase values, and the modified phase oscillation oscillates in accordance with a second periodicity greater than the first periodicity;
    wherein controlling the at least some of the N samplers to modify the phase oscillation of the input signal comprises controlling the at least some of the N samplers so that:
        at a first oscillation cycle, the input signal as appearing at a first sampler of the N samplers presents a first phase value, and
        at a second oscillation cycle subsequent to the first oscillation cycle, the input signal as appearing at the first sampler of the N samplers presents a second phase value different from the first phase value.

2. The TI ADC of claim 1, wherein controlling at least some of the N samplers to modify the phase oscillation of the input signal further comprises controlling the at least some of the N samplers so that:
    at the first oscillation cycle, the input signal as appearing at a second sampler of the N samplers presents a third phase value, and
    at the second oscillation cycle, the input signal as appearing at the second sampler of the N samplers presents a fourth phase value different from the third phase value.

3. The TI ADC of claim 1, wherein a first sampler of the N samplers comprises P switches, wherein P is a positive integer, and wherein controlling the at least some of the N samplers to modify the phase oscillation of the input signal further comprises:
    at the first oscillation cycle, controlling the first sampler to maintain a first subset of the P switches active.

4. The TI ADC of claim 3, wherein controlling at least some of the N samplers to modify the phase oscillation of the input signal further comprises:
    at the second oscillation cycle, controlling the first sampler to maintain a second subset of the P switches active, the second subset being different from the first subset.

5. The TI ADC of claim 1, wherein the second periodicity is at least twice the first periodicity.

6. The TI ADC of claim 1, wherein the control circuitry is configured to clock the N samplers so that each sampler samples the input signal appearing at the input terminal within a different time interval.

7. A time-interleaved (TI) analog-to-digital converter (ADC), comprising:
    an input terminal;
    a set of N paths electrically coupled to the input terminal, each path comprising a sampler configured to sample an input signal appearing at the input terminal, wherein N is a positive integer, wherein the N paths result in a phase oscillation of the input signal as appearing at the samplers, wherein the phase oscillation presents at most N phase values, and wherein the phase oscillation oscillates in accordance with a first periodicity; and
    control circuitry configured to control at least some of the N samplers to modify the phase oscillation of the input signal so that the modified phase oscillation presents more than N phase values, and the modified phase oscillation oscillates in accordance with a second periodicity greater than the first periodicity;
    wherein controlling at least some of the N samplers to modify the phase oscillation of the input signal comprises performing a phase permutation of the phase oscillation.

8. The TI ADC of claim 7, wherein performing the phase permutation of the phase oscillation comprises performing the phase permutation of the phase oscillation in accordance with a prime number.

9. The TI ADC of claim 7, wherein performing the phase permutation of the phase oscillation comprises performing the phase permutation of the phase oscillation in accordance with a random or pseudo-random cadence.

10. A method for controlling a time-interleaved (TI) analog-to-digital converter (ADC), comprising:
    receiving an input signal at each path of a set of N paths electrically coupled to an input terminal, wherein N is a positive integer, each path comprising a sampler configured to sample the input signal, wherein the N paths result in a phase oscillation of the input signal as appearing at the samplers, wherein the phase oscillation presents at most N phase values, and wherein the phase oscillation oscillates in accordance with a first periodicity;
    sampling the input signal with each sampler of the N samplers; and
    controlling at least some of the N samplers to modify the phase oscillation of the input signal so that the modified phase oscillation presents more than N phase values, and the modified phase oscillation oscillates in accordance with a second periodicity greater than the first periodicity;
    wherein controlling the at least some of the N samplers to modify the phase oscillation of the input signal comprises controlling the N samplers so that:
        at a first oscillation cycle, the input signal as appearing at a first sampler of the N samplers presents a first phase value, and
        at a second oscillation cycle subsequent to the first oscillation cycle, the input signal as appearing at the first sampler of the N samplers presents a second phase value different from the first phase value.

11. The method of claim 10, wherein controlling the at least some of the N samplers to modify the phase oscillation of the input signal further comprises controlling the N samplers so that:
    at the first oscillation cycle, the input signal as appearing at a second sampler of the N samplers presents a third phase value, and at the second oscillation cycle, the input signal as appearing at the second sampler of the N samplers presents a fourth phase value different from the third phase value.

12. The method of claim 10, wherein a first sampler of the N samplers comprises P switches, wherein P is a positive integer, and wherein controlling the at least some of the N samplers to modify the phase oscillation of the input signal further comprises:

at the first oscillation cycle, controlling the first sampler to maintain a first subset of the P switches active.

13. The method of claim 12, wherein controlling the at least some of the N samplers to modify the phase oscillation of the input signal further comprises:

at the second oscillation cycle, controlling the first sampler to maintain a second subset of the P switches active, the second subset being different from the first subset.

14. The method of claim 10, wherein the second periodicity is at least twice the first periodicity.

15. A method for controlling a time-interleaved (TI) analog-to-digital converter (ADC), comprising:

receiving an input signal at each path of a set of N paths electrically coupled to an input terminal, wherein N is a positive integer, each path comprising a sampler configured to sample the input signal, wherein the N paths result in a phase oscillation of the input signal as appearing at the samplers, wherein the phase oscillation presents at most N phase values, and wherein the phase oscillation oscillates in accordance with a first periodicity;

sampling the input signal with each sampler of the N samplers; and controlling at least some of the N samplers to modify the phase oscillation of the input signal so that the modified phase oscillation presents more than N phase values, and the modified phase oscillation oscillates in accordance with a second periodicity greater than the first periodicity;

wherein controlling the at least some of the N samplers to modify the phase oscillation of the input signal comprises performing a phase permutation of the phase oscillation.

16. The method of claim 15, wherein performing the phase permutation of the phase oscillation comprises performing the phase permutation of the phase oscillation in accordance with a prime number.

17. The method of claim 15, wherein performing the phase permutation of the phase oscillation comprises performing the phase permutation of the phase oscillation in accordance with a random or pseudo-random cadence.

18. The method of claim 10, wherein sampling the input signal with each sampler of the N samplers comprises clocking the N samplers so that each sampler samples the input signal within a different time interval.

* * * * *